US008606208B2

(12) United States Patent
Iida

(10) Patent No.: US 8,606,208 B2
(45) Date of Patent: Dec. 10, 2013

(54) FILTER CIRCUIT AND RADIO TERMINAL INCLUDING FILTER CIRCUIT

(75) Inventor: Sachio Iida, Chiba (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/553,951

(22) Filed: Jul. 20, 2012

(65) Prior Publication Data

US 2013/0049881 A1     Feb. 28, 2013

(30) Foreign Application Priority Data

Aug. 23, 2011   (JP) ................................. 2011-181341

(51) Int. Cl.
*H04B 1/26*       (2006.01)
(52) U.S. Cl.
USPC ............................ 455/307; 455/313; 455/323
(58) Field of Classification Search
USPC ......... 455/307, 313, 314, 323, 324, 325, 333, 455/334; 333/178, 180, 181, 182
See application file for complete search history.

(56) References Cited

U.S. PATENT DOCUMENTS

| | | | |
|---|---|---|---|
| 8,229,386 B1 * | 7/2012 | Hsu et al. ....................... | 455/313 |
| 2003/0119472 A1 * | 6/2003 | Das ............................... | 455/325 |
| 2010/0156564 A1 * | 6/2010 | Iida et al. ...................... | 333/181 |

OTHER PUBLICATIONS

Cook, B.W., et al., "Low-Power 2.4-GHz Transceiver With Passive RX Front-End and 400-mV Supply", IEEE Journal of Solid State Circuits, 2006, pp. 2757-2766, vol. 41, No. 12, University of California, Berkeley, CA.
Borremans, Jonathan et al., "A 40nm CMOS highly linear 0.4-to-6GHz receiver resilient to 0dBm out-of-band blockers", Digest of Technical Papers: ISSCC 2011/Session 3/RFTechniques/3.6, 2011, pp. 62-63, IEEE International Solid-State Circuits Conference.
Ghaffari, Amir et al., "A differential 4-path highly linear widely tunable on-chip band-pass filter", IEEE Radio Frequency Integrated Circuits Symposium, 2010, pp. 299-302.

* cited by examiner

*Primary Examiner* — Thanh Le
(74) *Attorney, Agent, or Firm* — Wolf, Greenfield & Sacks, P.C.

(57) ABSTRACT

There is provided a filter circuit including a passive mixer circuit, and a passive switched capacitor circuit that is connected to a rear stage of the passive mixer and includes a flying capacitor. The passive mixer circuit generates a baseband signal by multiplying an input signal supplied from a predetermined signal source impedance by each local oscillation signal and outputs the baseband signal to the passive switched capacitor circuit, the passive switched capacitor circuit performs predetermined filtering on the baseband signal supplied from the passive mixer circuit and outputs the processed baseband signal, and a capacitance of the flying capacitor of the passive switched capacitor circuit is a capacitance by which input impedance of the passive mixer circuit is matched to the signal source impedance.

12 Claims, 16 Drawing Sheets

FREQUENCY RANGE: 2300-2500 [MHz]

PHASE1

PHASE2

PHASE3

PHASE4

FREQUENCY RANGE: 2300-2500 [MHz]

FILTER CIRCUIT AND RADIO TERMINAL INCLUDING FILTER CIRCUIT

BACKGROUND

The present disclosure relates to a filter circuit and a radio terminal including the filter circuit.

A mixer that converts the frequency of a high-frequency band signal and a bandpass filter that attenuates a disturbing wave other than a high-frequency band are generally mounted on a reception front-end unit of a radio communication apparatus. Since the bandpass filter includes a surface acoustic wave filter and a dielectric resonator, it is difficult to incorporate the bandpass filter into a high-frequency integrated circuit. In recent years, however, attempts to integrate a frequency conversion filter circuit combining two functions of the mixer and the bandpass filter into the front-end unit of a receiver have been reported, as shown in "Low-Power 2.4-GHz Transceiver With Passive RX Font-End and 400-mV Supply" by B. W. Cook, A. Berny, A. Molnar, S. Lanzisera, and K. S. J. Pister, Journal of Solid State Circuits, Vol. 41, No. 12, pp. 2757-2766, December 2006, "A 40 nm CMOS Highly Linear 0.4-to-6 GHz Receiver Resilient to 0 dBm Out-of-Band Blockers" by J. Borremans, G Mandal, V. Giannini, T. Sano, M. Ingels, B. Verbruggen, and J. Craninckx, International Solid-State Circuits Conference (ISSCC) Dig. Tech. Papers, pp. 62-63, February 2011, and "A Differential 4-Path Highly Linear Widely Tunable On-Chip Band-Pass Filter" by A. Ghaffari, E. Klumperink, B. Nauta, IEEE Radio Frequency Integrated Circuits Symposium (RFIC), pp. 299-302, May 2010.

According to "Low-Power 2.4-GHz Transceiver With Passive RX Font-End and 400-mV Supply" by B. W. Cook, A. Berny, A. Molnar, S. Lanzisera, and K. S. J. Pister, Journal of Solid State Circuits, Vol. 41, No. 12, pp. 2757-2766, December 2006, the frequency conversion filter circuit outputs an input signal multiplied by a local oscillation signal to a capacitance element connected to an output side and returns a frequency response of the capacitance element connected to the output side to the input side by shifting only the local oscillation frequency of the local oscillation signal to a high-pass side. In the configuration and operation, the frequency conversion filter circuit operates as the same bandpass filter as a parallel LC filter resonating at a frequency of the local oscillation signal.

SUMMARY

In the frequency conversion filter circuit combining two functions of the mixer and the bandpass filter, a frequency range in which input impedance matching is satisfactory is preferably expanded, attenuation characteristics are preferably steepened, and an attenuation amount is preferably increased.

It is desirable to provide a novel and improved filter circuit and a novel and improved radio terminal including the filter circuit capable of expanding a frequency range in which input impedance matching is satisfactory, steepening attenuation characteristics, and increasing an attenuation amount.

According to an embodiment of the present disclosure, there is provided a filter circuit including a passive mixer circuit and a passive switched capacitor circuit that is connected to a rear stage of the passive mixer and includes a flying capacitor. The passive mixer circuit generates a baseband signal by multiplying an input signal supplied from a predetermined signal source impedance by each local oscillation signal and outputs the baseband signal to the passive switched capacitor circuit. The passive switched capacitor circuit performs predetermined filtering on the baseband signal supplied from the passive mixer circuit and outputs the processed baseband signal. A capacitance of the flying capacitor of the passive switched capacitor circuit is capacitance by which input impedance of the passive mixer circuit is matched to the signal source impedance.

In the filter circuit according to the embodiment of the present disclosure, the passive mixer circuit generates a baseband signal by multiplying the input signal supplied from the predetermined signal source impedance by the local oscillation signal. The generated baseband signal is output to the passive switched capacitor circuit. The passive switched capacitor circuit performs the predetermined filtering on the baseband signal supplied from the passive mixer circuit and outputs the processed baseband signal. The capacitance of the flying capacitor of the passive switched capacitor circuit is capacitance by which the input impedance of the passive mixer circuit is matched to the signal source impedance. In this configuration, the filter circuit according to the embodiment of the present disclosure can expand the frequency range in which the input impedance matching is satisfactory, steepen the attenuation characteristic, and increase the attenuation amount.

According to another embodiment of the present disclosure, there is provided a radio terminal including the filter circuit.

According to the embodiments of the present disclosure described above, it is possible to provide the novel and improved filter circuit and the novel and improved radio terminal including the filter circuit capable of expanding the frequency range in which the input impedance matching is satisfactory, steepening the attenuation characteristics, and increasing the attenuation amount.

DETAILED DESCRIPTION OF THE EMBODIMENTS

Figure 1:
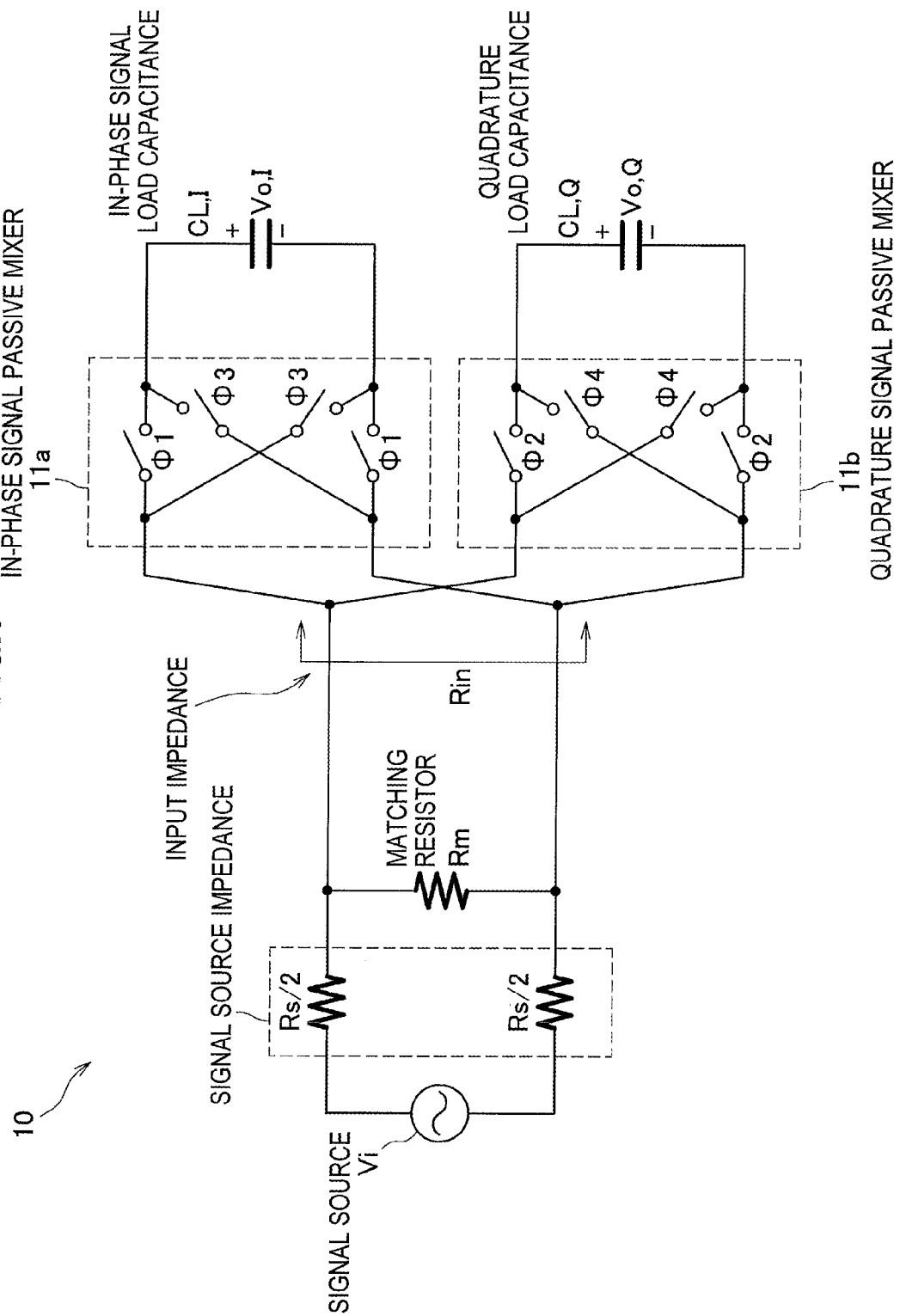
FIG. 1 is a diagram illustrating an example of the configuration of a frequency conversion filter circuit according to the related art.

Hereinafter, preferred embodiments of the present disclosure will be described in detail with reference to the accompanying drawings. Throughout the specification and the drawings, the same reference numerals are given to constituent elements having substantially the same configuration and the description thereof will not be repeated.

The description will be made in the following order.
1. Related Art
2. First Embodiment of the Present Disclosure
3. Second Embodiment of the Present Disclosure
4. Third Embodiment of the Present Disclosure
5. Summarization 1. Related Art FIG. 1 is a diagram illustrating an example of the configuration of a frequency conversion filter circuit according to the related art. A frequency conversion filter circuit 10 shown in FIG. 1 is a circuit obtained by rewriting a quadrature mixer model disclosed in FIG. 6 in a differential format in "Low-Power 2.4-GHz Transceiver With Passive RX Font-End and 400-mV Supply" by B. W. Cook, A. Berny, A. Molnar, S. Lanzisera, and K. S. J. Pister, Journal of Solid State Circuits, Vol. 41, No. 12, pp. 2757-2766, December 2006. Further, a switch resistor Rsw of a passive mixer disclosed in FIG. 6 in "Low-Power 2.4-GHz Transceiver With Passive RX Font-End and 400-mV Supply" by B. W. Cook, A. Berny, A. Molnar, S. Lanzisera, and K. S. J. Pister, Journal of Solid State Circuits, Vol. 41, No. 12, pp. 2757-2766, December 2006 is not illustrated in FIG. 1, since the switch resistor Rsw is not necessary in the following description. Conversely, a matching resistor Rm disclosed in FIG. 6 in "Low-Power 2.4-GHz Transceiver With Passive RX Font-End and 400-mV Supply" by B. W. Cook, A. Berny, A. Molnar, S. Lanzisera, and K. S. J. Pister, Journal of Solid State Circuits, Vol. 41, No. 12, pp. 2757-2766, December 2006 is added, since the matching resistor Rm is necessary in the following description. The matching resistor Rm will be described in detail later.

A signal source Vi is a high-frequency signal source which has a signal source impedance Rs. In the frequency conversion filter circuit 10 shown in FIG. 1, the matching resistor Rm, an in-phase signal passive mixer 11a, and a quadrature signal passive mixer 11b are connected to each other in parallel. An in-phase signal load capacitance CL,I and a quadrature signal load capacitance CL,Q are connected to the output sides of the in-phase signal passive mixer 11a and the quadrature signal passive mixer 11b, respectively. Both-end voltages Vo,I and Vo,Q of the load capacitances are the output voltages of the frequency conversion filter circuit 10 shown in FIG. 1.

Figure 2:
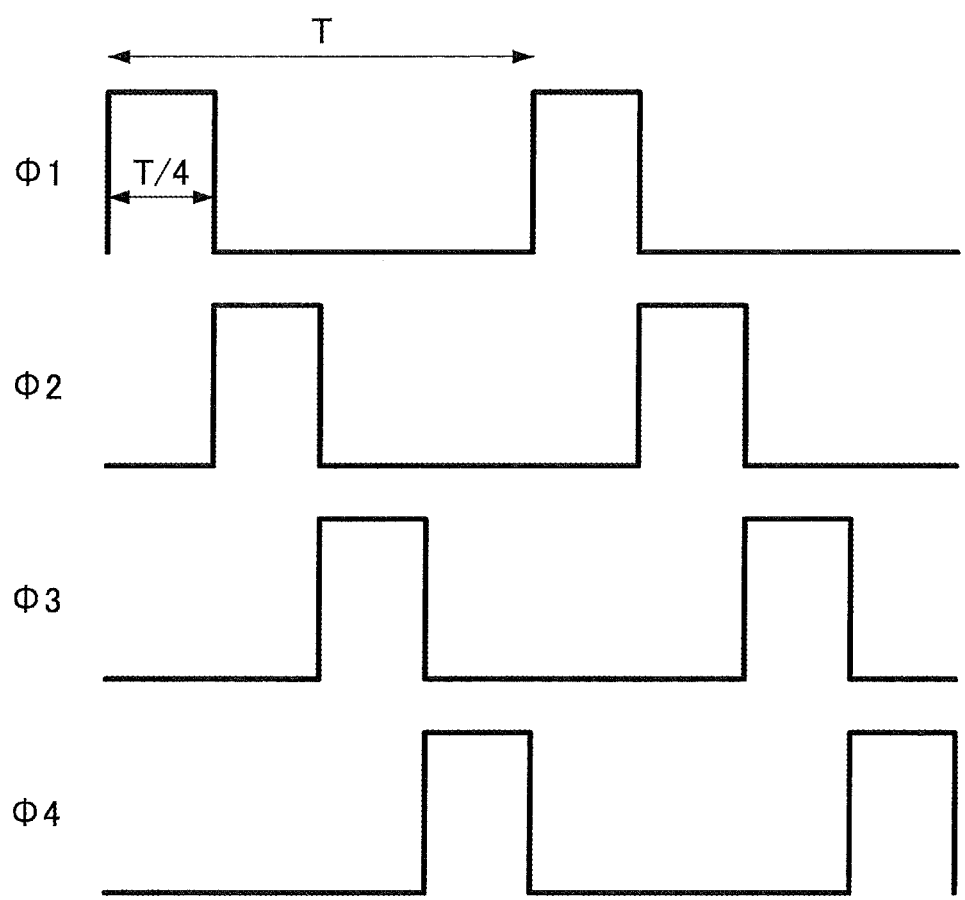
FIG. 2 is a diagram illustrating the waveforms of local oscillation signals applied to passive mixers of the frequency conversion filter circuit shown in FIG. 1.

FIG. 2 is a diagram illustrating the waveforms of local oscillation signals applied to the in-phase signal passive mixer 11a and the quadrature signal passive mixer 11b of the frequency conversion filter circuit 10 shown in FIG. 1. As shown in FIG. 2, the in-phase signal passive mixer 11a and the quadrature signal passive mixer 11b are switches that are driven by four-phase local oscillation signals Φ1, Φ2, Φ3, and Φ4 of square waves having a period T, a duty ratio of 25%, and phases different from each other by 90 degrees. The in-phase signal passive mixer 11a is supplied with the two-phase phase local oscillation signals Φ1 and Φ3 of the square waves having the duty ratio of 25% and the phases different from each other by 180 degrees. The quadrature signal passive mixer 11b is supplied with the two-phase phase local oscillation signals Φ2 and Φ4 of the square waves having the duty ratio of 25% and the phases different from each other by 180 degrees. Each switch is turned on when the local oscillation signal is at a high level, and turned off when the local oscillation signal is at a low level.

When the duty ratio of the local oscillation signal is 25%, the input impedance Rin of the frequency conversion filter circuit 10 at the frequency of the local oscillation signal is a value expressed by Equation 1.

$$Rin = \frac{\pi^2 R_S}{2(\pi^2 - 8)} \qquad \text{Equation 1}$$

Figure 3:
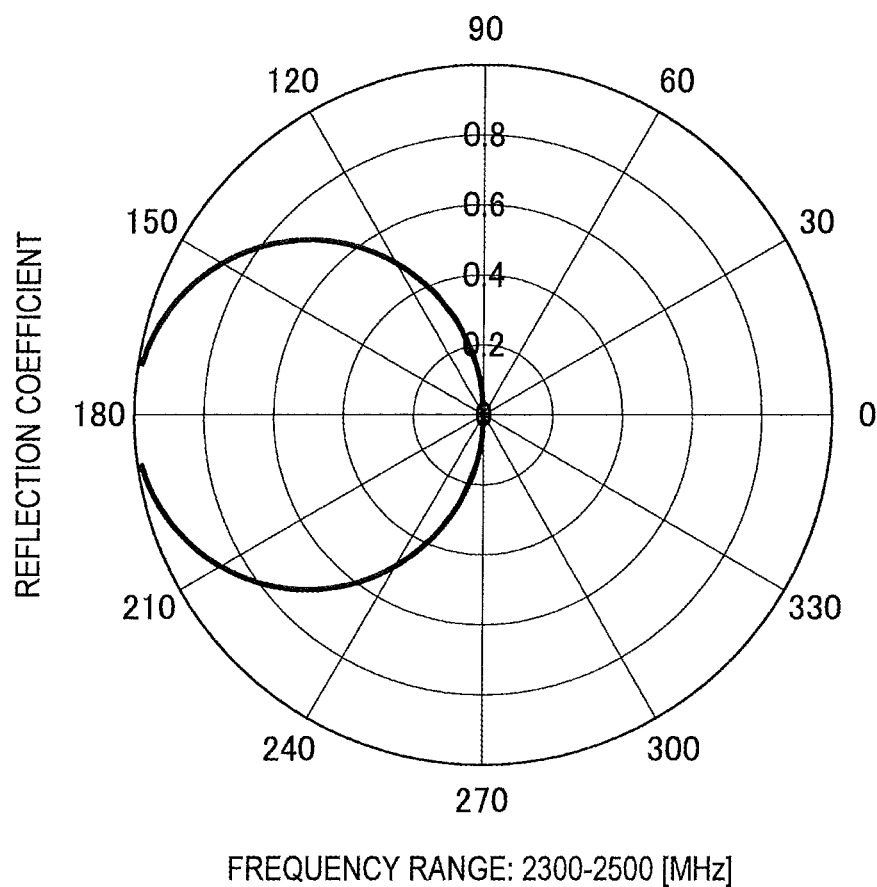
FIG. 3 is a diagram illustrating an input reflection coefficient of the frequency conversion filter circuit shown in FIG. 1 on the Smith chart.

In this equation, when Rs is 200Ω, Rin is 527Ω. Therefore, since Rs and Rin are different, the impedances do not match. Accordingly, an example in which the matching resistor Rm is disposed in parallel so that the impedances is matched is disclosed in FIG. 3 in "A Differential 4-Path Highly Linear Widely Tunable On-Chip Band-Pass Filter" by A. Ghaffari, E. Klumperink, B. Nauta, IEEE Radio Frequency Integrated Circuits Symposium (RFIC), pp. 299-302, May 2010. In FIG. 3 in "A Differential 4-Path Highly Linear Widely Tunable On-Chip Band-Pass Filter" by A. Ghaffari, E. Klumperink, B. Nauta, IEEE Radio Frequency Integrated Circuits Symposium (RFIC), pp. 299-302, May 2010 ("A 40 nm CMOS Highly Linear 0.4-to-6 GHz Receiver Resilient to 0 dBm Out-of-Band Blockers" by J. Borremans, G Mandal, V. Giannini, T. Sano, M. Ingels, B. Verbruggen, and J. Craninckx, International Solid-State Circuits Conference (ISSCC) Dig. Tech. Papers, pp. 62-63, February 2011), the signal source impedance viewed from the rear side of a balun having a winding number ratio of 1:2 is four times. Therefore, when 4Rs is rewritten to Rs', the matching resistance is a value expressed by Equation 2.

$$Rm = \frac{\pi^2 R_S}{16 - \pi^2} \quad \text{Equation 2}$$

In Equation 2, when Rs is 200Ω, Rm is 322Ω. The impedances match due to the parallel resistances of Rm and Rin.

The input impedance Rin of the frequency conversion filter circuit is a value expressed in Equation 1 for the following reasons. First, Equation 1-1 below is obtained from "A Differential 4-Path Highly Linear Widely Tunable On-Chip Band-Pass Filter" by A. Ghaffari, E. Klumperink, B. Nauta, IEEE Radio Frequency Integrated Circuits Symposium (RFIC), pp. 299-302, May 2010 ("Low-Power 2.4-GHz Transceiver With Passive RX Font-End and 400-mV Supply" by B. W. Cook, A. Berny, A. Molnar, S. Lanzisera, and K. S. J. Pister, Journal of Solid State Circuits, Vol. 41, No. 12, pp. 2757-2766, December 2006).

$$Rin = \frac{8R_{OUT}}{\pi^2 - 8} \quad \text{Equation 1-1}$$

Rout of Equation 3 satisfies Equation 1-2 below, since Rout is the parallel resistance of Rs' and Rm from FIG. 3 of "A Differential 4-Path Highly Linear Widely Tunable On-Chip Band-Pass Filter" by A. Ghaffari, E. Klumperink, B. Nauta, IEEE Radio Frequency Integrated Circuits Symposium (RFIC), pp. 299-302, May 2010.

$$R_{OUT} = \frac{R'_S Rm}{R'_S + Rm} \quad \text{Equation 1-2}$$

Accordingly, when Equation 2 and Equation 1-2 are substituted into Equation 1-1, a relation of Equation 1 above is satisfied as follows.

$$Rin = \frac{8R_{OUT}}{\pi^2 - 8} = \frac{8 \frac{R'_S \frac{\pi^2 R'_S}{16 - \pi^2}}{R'_S + \frac{\pi^2 R'_S}{16 - \pi^2}}}{\pi^2 - 8} = \frac{\frac{8R'_S \pi^2 R'_S}{R'_S(16 - \pi^2) + \pi^2 R'_S}}{\pi^2 - 8} = \frac{R'_S \pi^2}{2(\pi^2 - 8)}$$

Here, the element constants of the frequency conversion filter circuit shown in FIG. 1 are assumed to be as follows:
the signal source impedance Rs: 200Ω,
the resistance of the matching resistor Rm: 322Ω
the capacitance of the in-phase signal load capacitance CL,I and the quadrature signal load capacitance CL,Q: 50 pF each, and
the frequency of the local oscillation signals Φ1, Φ2, Φ3, and Φ4: 2400 MHz.

FIG. 3 is a diagram illustrating an input reflection coefficient in the range of 2300 MHz to 2500 MHz indicated on the Smith chart when the element constants of the frequency conversion filter circuit 10 shown in FIG. 1 are set to the above-mentioned values. As shown in FIG. 3, the input reflection coefficient of the frequency conversion filter circuit 10 shown in FIG. 1 in the range of 2300 MHz to 2500 MHz is formed in an arc shape on the Smith chart.

Figure 4:
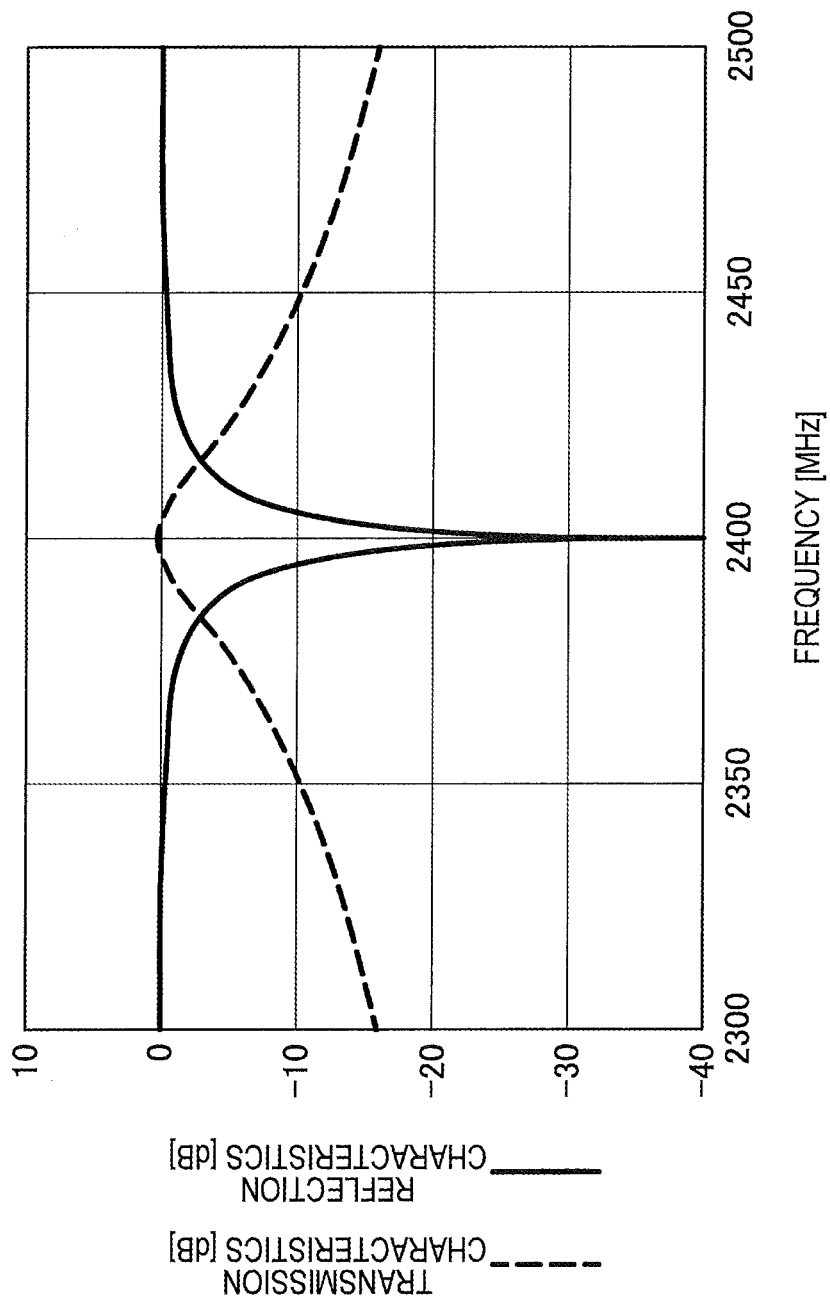
FIG. 4 is a diagram illustrating the reflection characteristics and the transmission characteristics of the frequency conversion filter circuit shown in FIG. 1.

FIG. 4 is a diagram illustrating the reflection characteristics and the transmission characteristics when the element constants of the frequency conversion filter circuit 10 shown in FIG. 1 are set to the above-mentioned values. In the graph shown in FIG. 4, a solid line indicates the reflection characteristics of the frequency conversion filter circuit 10 and a dashed line indicates the transmission characteristics of the frequency conversion filter circuit 10. As shown in FIG. 4, the reflection characteristics and the transmission characteristics of the frequency conversion filter circuit 10 shown in FIG. 1 are symmetric when 2400 MHz is centered.

Figure 5:
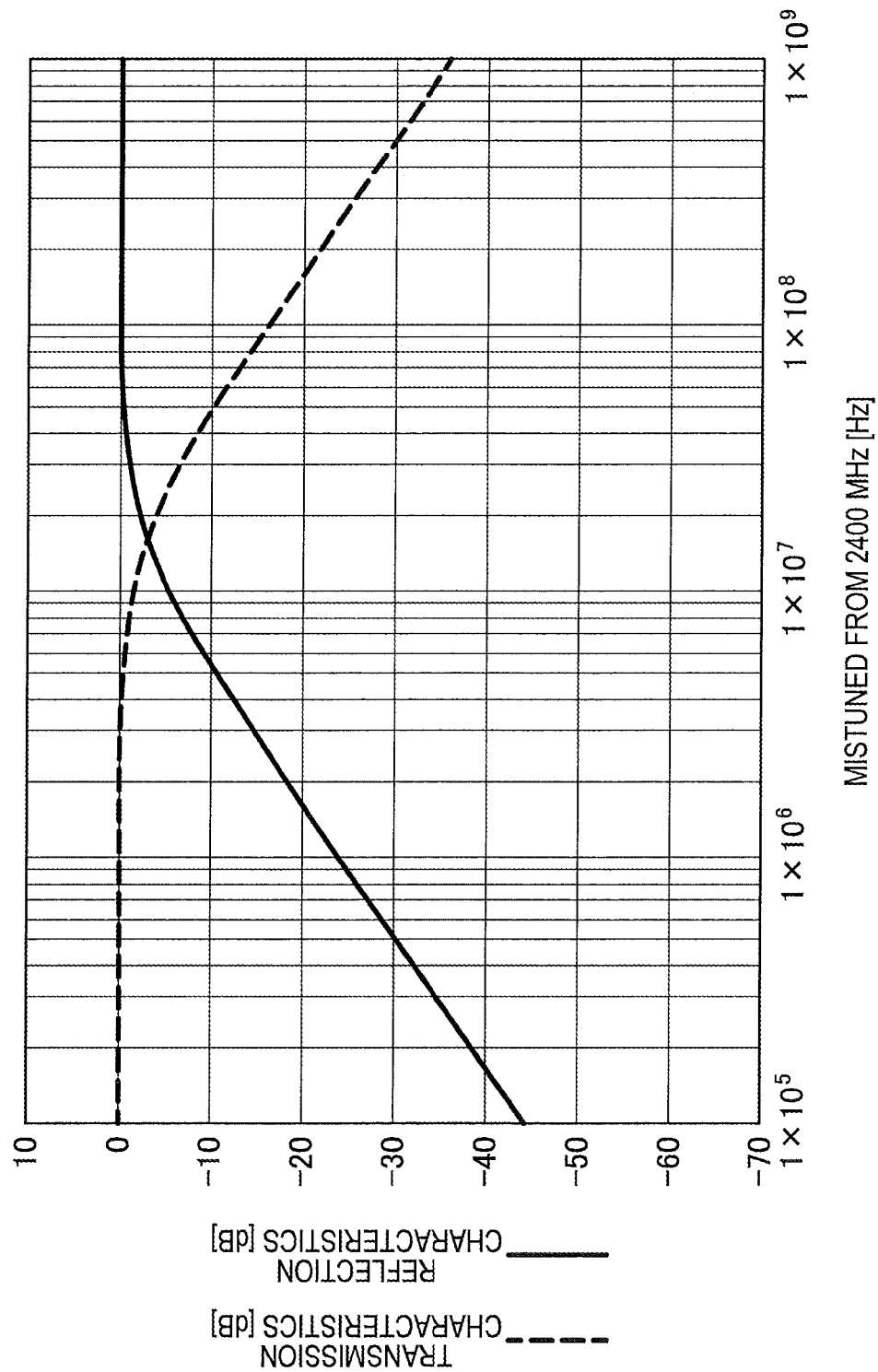
FIG. 5 is a diagram illustrating the reflection characteristics and the transmission characteristics of the frequency conversion filter circuit shown in FIG. 1 expressed by a mistuned frequency.

FIG. 5 is a diagram illustrating the reflection characteristics and the transmission characteristics expressed by a mistuned frequency from 2400 MHz when the element constants of the frequency conversion filter circuit 10 shown in FIG. 1 are set to the above-mentioned values. In the graph shown in FIG. 5, a solid line indicates the reflection characteristics of the frequency conversion filter circuit 10 and a dashed line indicates the transmission characteristics of the frequency conversion filter circuit 10, as in FIG. 4.

In general, a frequency range in which the transmission characteristics are lowered by up to 3 dB from the maximum value is the bandwidth of a filter. Further, when a reflection coefficient is equal to or less than −14 dB, a frequency range in which impedance matching is satisfactory is obtained. As understood from FIGS. 4 and 5, however, the bandwidth of a filter is about 2400 MHz±12 MHz when the element constants of the frequency conversion filter circuit 10 shown in FIG. 1 are set to the above-mentioned values. On the other hand, the range in which the impedance matching is satisfactory is restricted to a narrower range which is about 2400 MHz±3 MHz and about a quarter of the bandwidth of the filter. Further, even when the mistuned frequency is ten times, the attenuation amount increases only by 20 dB. Therefore, it is difficult to increase the attenuation amount with respect to a neighborhood disturbing wave.

Accordingly, in embodiments of the present disclosure to be described below, a frequency conversion filter circuit expanding a frequency range in which input impedance matching is satisfactory, steepening attenuation characteristics, and increasing an attenuation amount and a radio receiver using the frequency conversion filter circuit in a front-end unit will be described.

2. First Embodiment of the Present Disclosure

Figure 6:
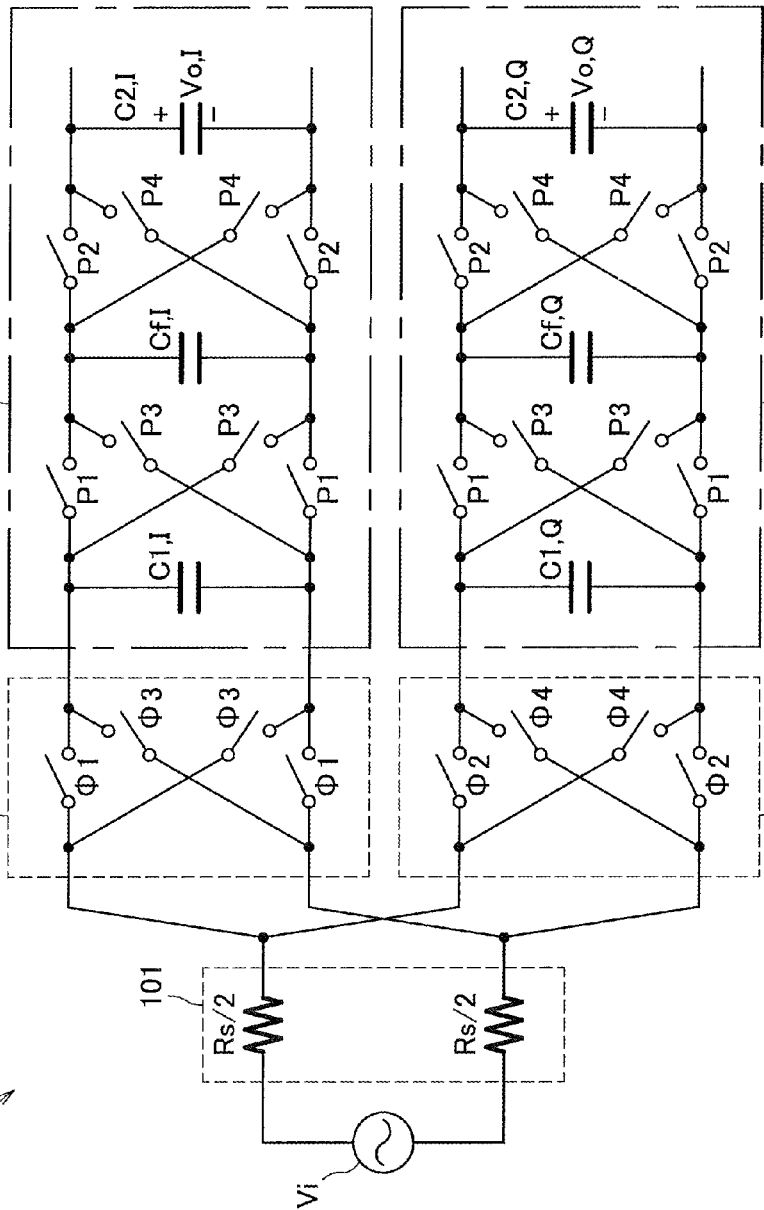
FIG. 6 is a diagram illustrating the configuration of a frequency conversion filter circuit according to a first embodiment of the present disclosure.

First, a frequency conversion filter circuit according to a first embodiment of the present disclosure will be described. FIG. 6 is a diagram illustrating the configuration of the frequency conversion filter circuit according to the first embodiment of the present disclosure. Hereinafter, the configuration of the frequency conversion filter circuit according to the first embodiment of the present disclosure will be described with reference to FIG. 6.

As shown in FIG. 6, the frequency conversion filter circuit 100 according to the first embodiment of the present disclosure includes a signal source impedance 101 including a signal source Vi and two resistors, an in-phase signal passive mixer 111, a quadrature signal passive mixer 112, an in-phase signal passive switched capacitor circuit 121, and a quadrature signal passive switched capacitor circuit 122.

In the frequency conversion filter circuit 100 shown in FIG. 6, two passive mixer circuits and two passive switched capacitor circuits for in-phase and quadrature signals are connected to the signal source Vi of the signal source impedance Rs. Compared to the related art shown in FIG. 1, the matching resistor Rm on the input side is not connected, since the matching resistor Rm is no longer necessary. Further, the in-phase signal passive switched capacitor circuit 121 and the quadrature signal passive switched capacitor circuit 122 are provided instead of the load capacitances CL,I and CL,Q on the output side.

The in-phase signal passive mixer 111 and the quadrature signal passive mixer 112 multiply input signals by local oscillation signals with different phases and output the results. For example, as in the related art, the in-phase signal passive mixer 111 and the quadrature signal passive mixer 112 are configured as switches that are driven by four-phase local oscillation signals $\Phi 1$, $\Phi 2$, $\Phi 3$, and $\Phi 4$ of square waves having a period T, a duty ratio of 25%, and phases different from each other by 90 degrees, as in FIG. 2. The in-phase signal passive mixer 111 is supplied with the two-phase phase local oscillation signals $\Phi 1$ and $\Phi 3$ of the square waves having the duty ratio of 25% and the phases different from each other by 180 degrees. The quadrature signal passive mixer 112 is supplied with the two-phase phase local oscillation signals $\Phi 2$ and $\Phi 4$ of the square waves having the duty ratio of 25% and the phases different from each other by 180 degrees. The in-phase signal passive mixer 111 and the quadrature signal passive mixer 112 are each turned on when the local oscillation signal is at a high level, and turned off when the local oscillation signal is at a low level.

The in-phase signal passive switched capacitor circuit 121 includes a flying capacitor Cf,I that maintains its polarity when switched from the input end to the output end through a switching operation, while reversing its polarity when switched from the output end to the input end; a first capacitor C1,I that is connected in parallel to the flying capacitor at the input end of the in-phase signal passive switched capacitor circuit 121; and a second capacitor C2,I that is connected in parallel to the flying capacitor at the output end of the in-phase signal passive switched capacitor circuit 121.

The quadrature signal passive switched capacitor circuit 122 includes a flying capacitor Cf,Q that maintains its polarity when switched from the input end to the output end through a switching operation, while reversing its polarity when switched from the output end to the input end; a first capacitor C1,Q that is connected in parallel to the flying capacitor at the input end of the quadrature signal passive switched capacitor circuit 122; and a second capacitor C2,Q that is connected in parallel to the flying capacitor at the output end of the quadrature signal passive switched capacitor circuit 122.

A both-end voltage Vo,I of the second capacitor of the in-phase signal passive switched capacitor circuit 121 and a both-end voltage Vo,Q of the second capacitor of the quadrature signal passive switched capacitor circuit 122 are the output voltages of the frequency conversion filter circuit 100.

Figure 7:
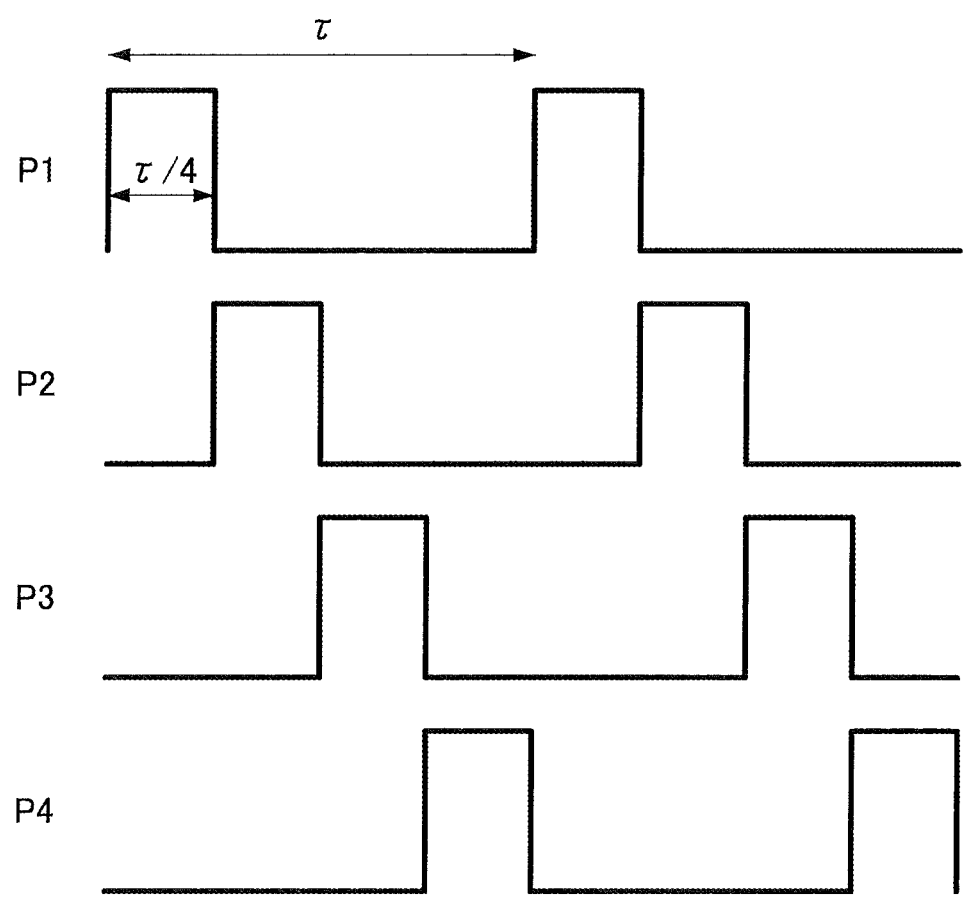
FIG. 7 is a diagram illustrating the waveforms of clocks used to drive switches included in an in-phase signal passive switched capacitor circuit 121 and a quadrature signal passive switched capacitor circuit 122.
Figure 8A:
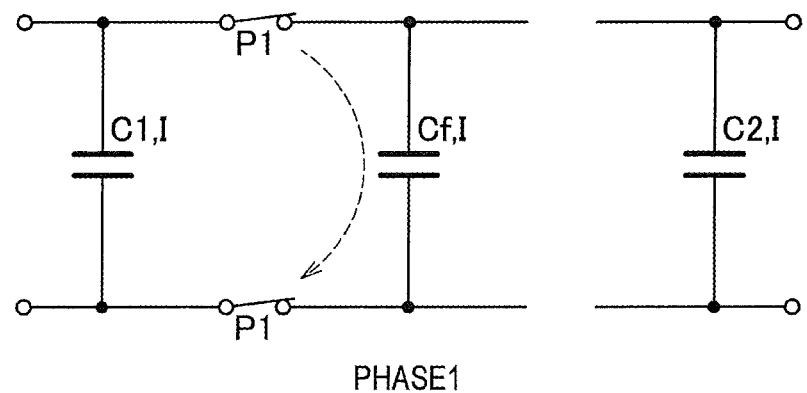
FIG. 8A is a diagram illustrating states of the in-phase signal passive switched capacitor circuit 121 and the quadrature signal passive switched capacitor circuit 122 changed when the clock is supplied.
Figure 8B:
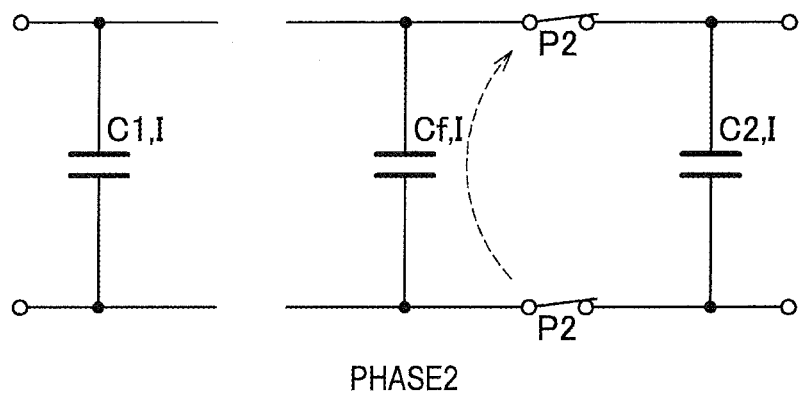
FIG. 8B is a diagram illustrating states of the in-phase signal passive switched capacitor circuit 121 and the quadrature signal passive switched capacitor circuit 122 changed when the clock is supplied.
Figure 8C:
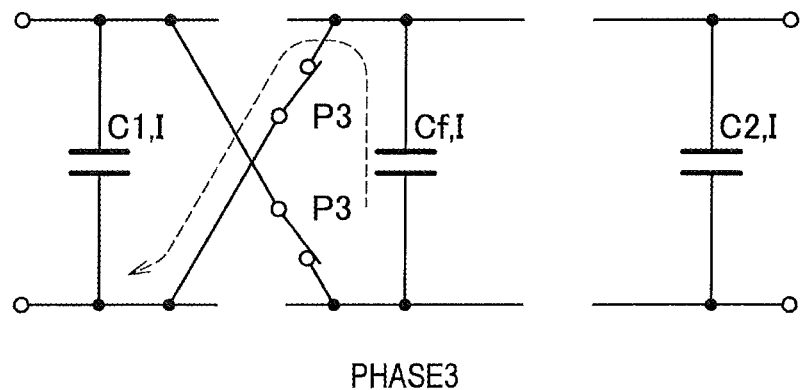
FIG. 8C is a diagram illustrating states of the in-phase signal passive switched capacitor circuit 121 and the quadrature signal passive switched capacitor circuit 122 changed when the clock is supplied.
Figure 8D:
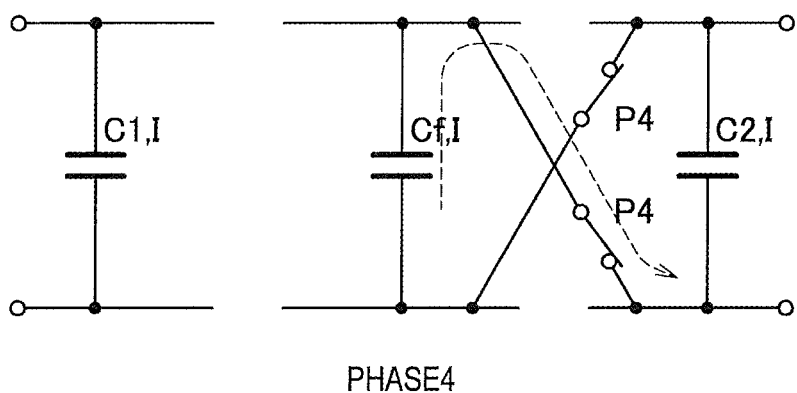
FIG. 8D is a diagram illustrating states of the in-phase signal passive switched capacitor circuit 121 and the quadrature signal passive switched capacitor circuit 122 changed when the clock is supplied.

FIG. 7 is a diagram illustrating the waveforms of clocks used to drive switches included in the in-phase signal passive switched capacitor circuit 121 and the quadrature signal passive switched capacitor circuit 122. As shown in FIG. 7, the clocks used to drive the switches included in the in-phase signal passive switched capacitor circuit 121 and the quadrature signal passive switched capacitor circuit 122 are clocks P1, P2, P3, and P4 of square waves having a duty ratio of 25%, and phases different from each other by 90 degrees. In the first embodiment of the present disclosure, a period $\tau$ of the clock is the same as the period T of the local oscillation signal and a timing is also synchronized. Accordingly, the clocks P1, P2, P3, and P4 and the local oscillation signals $\Phi 1$, $\Phi 2$, $\Phi 3$, and $\Phi 4$ have the same waveform. However, the period $\tau$ of the clock may be different from the period T of the local oscillation signal, as will be described later in a second embodiment.

FIGS. 8A to 8D are diagrams illustrating states of the in-phase signal passive switched capacitor circuit 121 and the quadrature signal passive switched capacitor circuit 122 changed when the locks are supplied. FIGS. 8A to 8D show the states of the in-phase signal passive switched capacitor circuit 121 and the quadrature signal passive switched capacitor circuit 122 as PHASE 1, PHASE 2, PHASE 3, and PHASE 4, respectively, when the clocks P1, P2, P3, and P4 are at a high level.

In a single circulating operation of the in-phase signal passive switched capacitor circuit 121 and the quadrature signal passive switched capacitor circuit 122 shown in FIGS. 8A to 8D, when PHASE 1 is switched to PHASE 2, the polarity of the flying capacitor is maintained and is moved in parallel. When PHASE 2 is switched to PHASE 3, the flying capacitor is reversed, and thus the polarity is reversed and moved. When PHASE 3 is switched to PHASE 4, the polarity is maintained with the flying capacitor inverted and is moved in parallel. When PHASE 4 is switched to PHASE 1, the polarity is reversed and moved so that the polarity of the flying capacitor is returned to the original polarity.

A calculation equation used to determine the capacitance of the flying capacitor is given as in Equation 3. It is assumed that Rs is 200Ω, a clock frequency fsc is 2400 MHz, and the capacitance of the flying capacitor is 162 fF.

$$C_f = \frac{16 - \pi^2}{8\pi^2 R_s f_{SC}} \quad \text{Equation 3}$$

The calculation equation is given to determine the capacitance of the flying capacitor for the following reasons. That is, when the resistor Rm of the frequency conversion filter circuit shown in FIG. 1 is divided into two as I and Q and is moved to the rear stage of the mixers, 2 Rm is obtained. Accordingly, when the input impedance Zin of the in-phase signal passive switched capacitor circuit 121 and the quadrature signal passive switched capacitor circuit 122 is set to 2 Rm, the impedance matching can be achieved.

$$Zin = 2Rm \quad \text{Equation 3-1}$$

Figure 9:
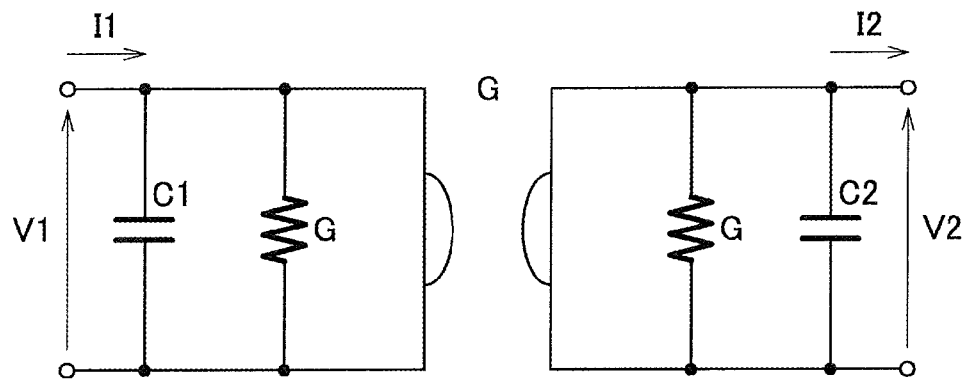
FIG. 9 is a diagram illustrating a continuous-time equivalent circuit with which the passive switched capacitor circuit is substituted.

When the in-phase signal passive switched capacitor circuit 121 and the quadrature signal passive switched capacitor circuit 122 are simplified by omitting a time delay caused due to the clock, the in-phase signal passive switched capacitor circuit 121 and the quadrature signal passive switched capacitor circuit 122 can be expressed as a continuous-time equivalent circuit in which conductances G and capacitors C1 and C2 are attached to both sides of a gyrator, as in FIG. 9.

Parameters A, B, C, and D (parameters F) of the continuous-time equivalent circuit shown in FIG. 9 are as follows.

$$\begin{bmatrix} V_1 \\ I_1 \end{bmatrix} = \begin{bmatrix} A & B \\ C & D \end{bmatrix} \begin{bmatrix} V_2 \\ I_2 \end{bmatrix} \begin{bmatrix} A & B \\ C & D \end{bmatrix} = \begin{bmatrix} 1 + sC_2 G^{-1} & G^{-1} \\ 2G + s(C_1 + C_2) + s^2 C_1 C_2 G^{-1} & 1 + sC_1 G^{-1} \end{bmatrix}$$

Cf reciprocates twice at one period of the clock. Therefore, the conductance G is as follows.

$$G = 2f_{SC} C_f \quad \text{Equation 3-2}$$

The input impedance Zin of the continuous-time equivalent circuit shown in FIG. 9 is as follows.

$$Zin = \frac{V_1}{I_1}\bigg|_{I_2=0} = \frac{A}{C} = \frac{1+sC_2G^{-1}}{2G+s(C_1+C_2)+s^2C_1C_2G^{-1}} \quad \text{Equation 3-3}$$

When "s=0" and Equation 3-2 is substituted into Equation 3-3, the direct-current input impedance Zin of the continuous-time equivalent circuit shown in FIG. 9 is as follows.

$$Zin|_{s=0} = \frac{1}{2G} = \frac{1}{4f_{SC}C_f} \quad \text{Equation 3-4}$$

The following relation is established from Equation 3-1 and Equation 3-4.

$$Rm = \frac{1}{8f_{SC}C_f} \quad \text{Equation 3-5}$$

Further, the following equation is established from Equation 2 and Equation 3-5. This equation is Equation 3.

$$C_f = \frac{1}{8Rmf_{SC}} = \frac{16-\pi^2}{8\pi^2 R_s f_{SC}} \quad \text{Equation 3}$$

Equation 3 above is an equation that is used to match the impedance at a center frequency. In the embodiment of the present disclosure, the value of Cf may be set to be larger by about 10% in order to expand the range in which the impedance matching is satisfactory. For example, when the value of Cf is 160 fF by Equation 3, the actual capacitance may be set to 180 fF.

The element constants of the frequency conversion filter circuit 100 shown in FIG. 6 are assumed to be set as follows:
the signal source impedance Rs: 200Ω,
the frequency of the local oscillation signals Φ1, Φ2, Φ3, and Φ4: 2400 MHz,
the frequency of the clocks P1, P2, P3, and P4: 2400 MHz,
the capacitance of the first capacitors C1,I and C1,Q: 12.5 pF,
the capacitance of the flying capacitors Cf,I and Cf,Q: 180 fF, and
the capacitance of the second capacitors C2,I and C2,Q: 12.5 pF.

Figure 10:
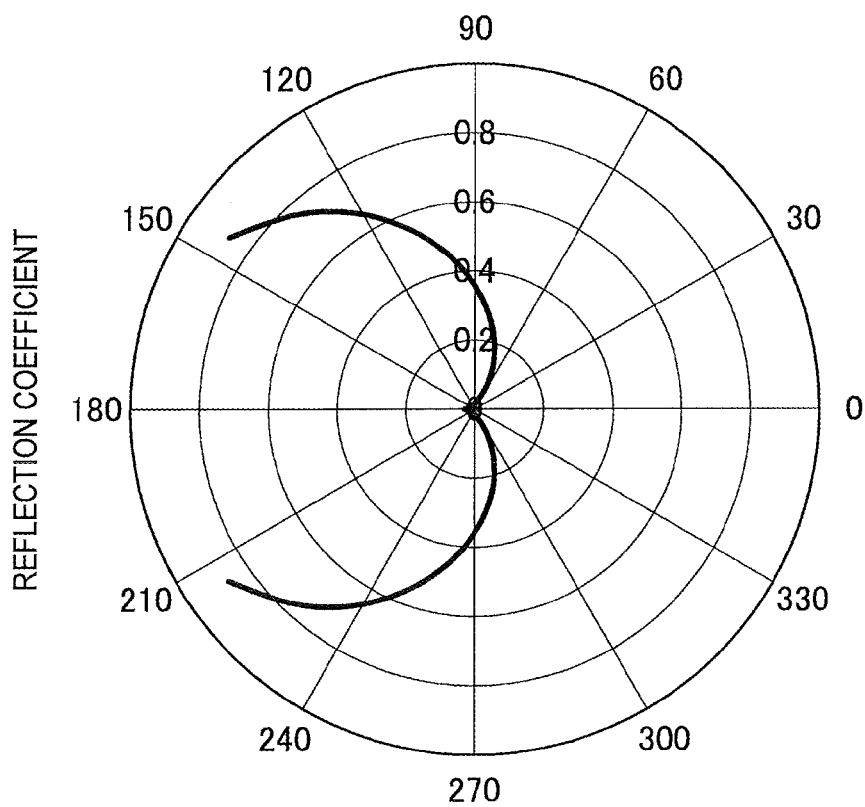
FIG. 10 is a diagram illustrating an input reflection coefficient of the frequency conversion filter circuit shown in FIG. 6 on the Smith chart.

FIG. 10 is a diagram illustrating an input reflection coefficient in the range of 2300 MHz to 2500 MHz indicated on the Smith chart when the element constants of the frequency conversion filter circuit 100 shown in FIG. 6 are set to the above-mentioned values. As shown in FIG. 10, the input reflection coefficient in the range of 2300 MHz to 2500 MHz is present in a cardioid shape in which a kink is present in the middle of the Smith chart. When the capacitances of the flying capacitors Cf,I and Cf,Q are set to be larger by about 10%, the kink is formed near the origin of the Smith chart.

Figure 11:
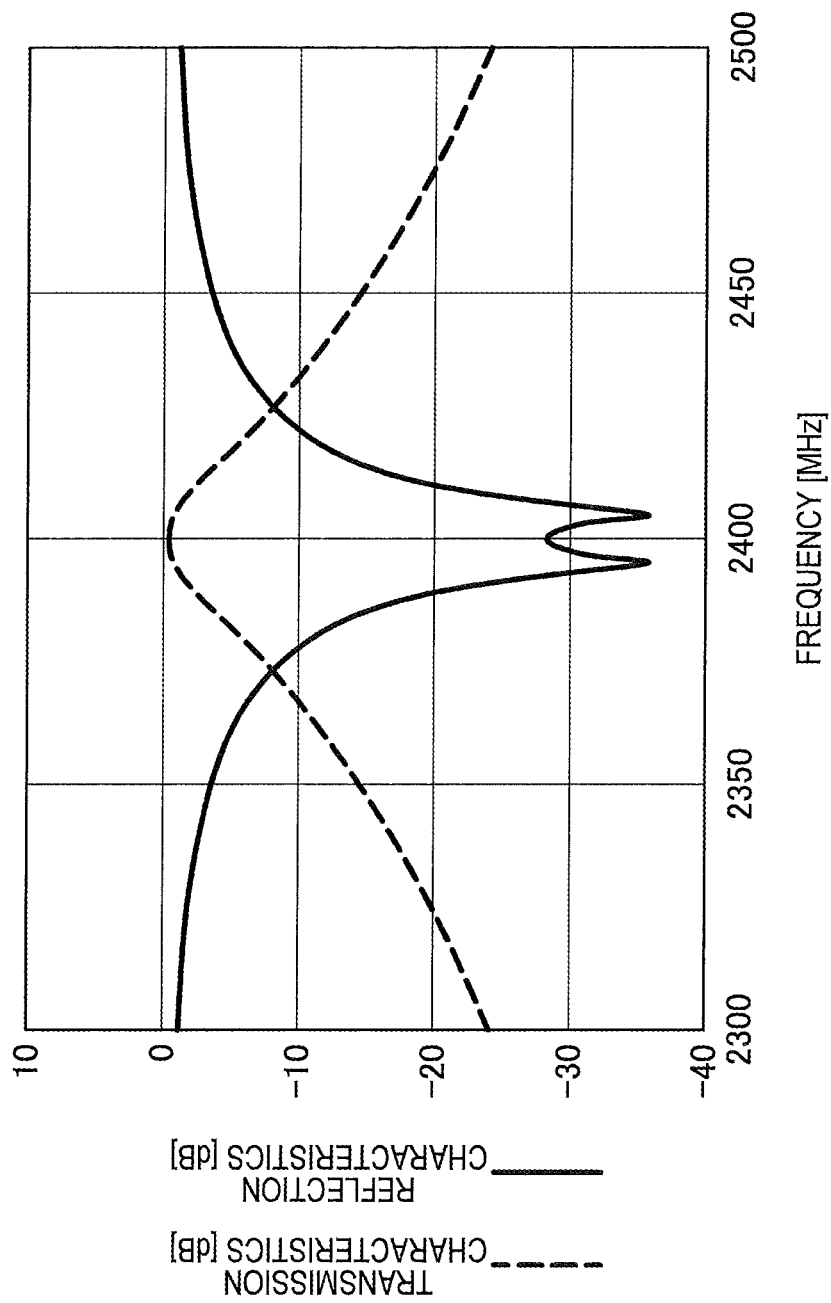
FIG. 11 is a diagram illustrating the reflection characteristics and the transmission characteristics of the frequency conversion filter circuit shown in FIG. 6.

FIG. 11 is a diagram illustrating the reflection characteristics and the transmission characteristics when the element constants of the frequency conversion filter circuit 100 shown in FIG. 6 are set to the above-mentioned values. In the reflection characteristics of the frequency conversion filter circuit 100, as shown in FIG. 11, two minimum values are present in frequencies slightly offset from 2400 MHz. Accordingly, in the frequency conversion filter circuit 100 shown in FIG. 6, the bandwidth of the filter is expanded further than the frequency conversion filter circuit according to the related art.

Figure 12:
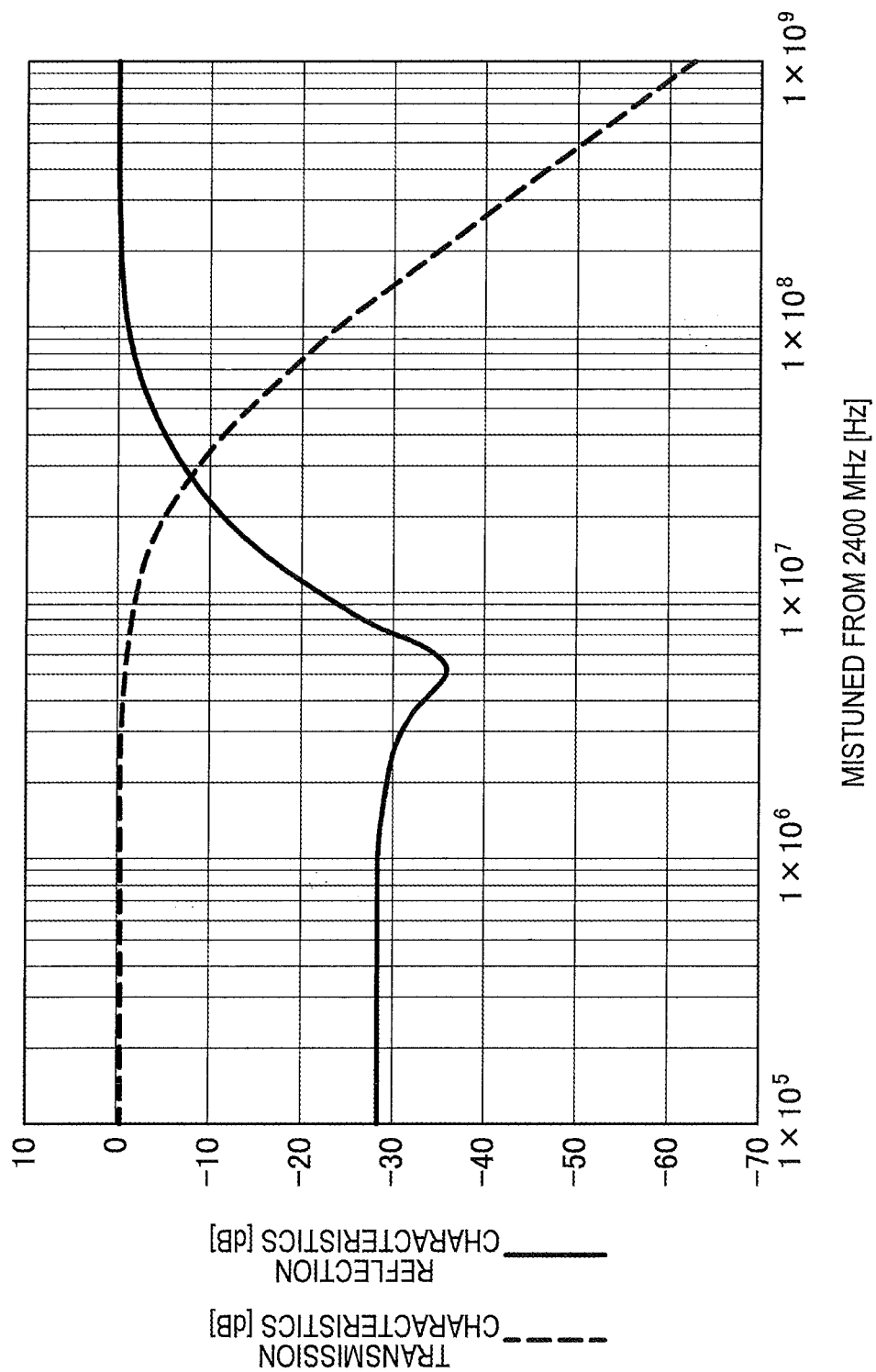
FIG. 12 is a diagram illustrating the reflection characteristics and the transmission characteristics of the frequency conversion filter circuit shown in FIG. 6 expressed by a mistuned frequency.

FIG. 12 is a diagram illustrating the reflection characteristics and the transmission characteristics expressed by a mistuned frequency from 2400 MHz when the element constants of the frequency conversion filter circuit 100 shown in FIG. 6 are set to the above-mentioned values. In general, a frequency range in which the transmission characteristics are lowered up to 3 dB from the maximum value is the bandwidth of a filter. Further, when a reflection coefficient is equal to or less than −14 dB, a frequency range in which impedance matching is satisfactory is obtained. As understood from FIGS. 11 and 12, the bandwidth of the filter of the frequency conversion filter circuit 100 shown in FIG. 6 is about 2400 MHz±12 MHz. The frequency range in which impedance matching is satisfactory is also about 2400 MHz±12 MHz and is substantially the same as the bandwidth of the filter. Further, when the mistuned frequency is ten times, it is possible to obtain the steep attenuation characteristics in which the attenuation amount increases by 40 dB.

Figure 13:
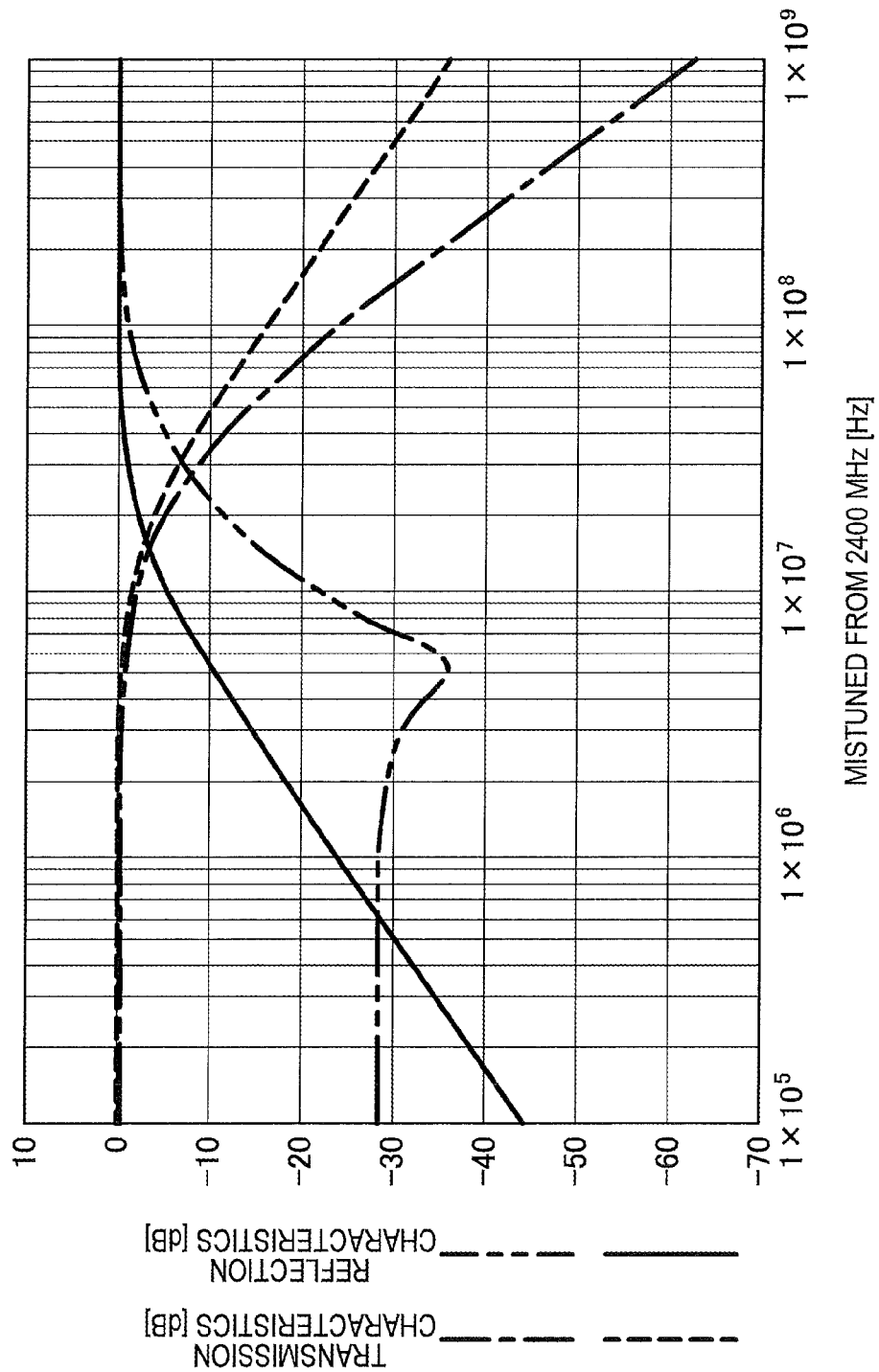
FIG. 13 is a graph in which the maximum value is normalized to 0 dB to compare the frequency characteristics between the related art and the first embodiment of the present disclosure

FIG. 13 is a graph in which the maximum value is normalized to 0 dB to compare the frequency characteristics between the related art and the first embodiment of the present disclosure. As indicated by the transmission characteristics of the graph shown in FIG. 13, it is clarified that the bandwidth of the filter is the same between the frequency conversion filter circuit according to the related art and the frequency conversion filter circuit 100 according to the first embodiment of the present disclosure. Here, in the frequency conversion filter circuit according to the related art, the sum capacitance of CL,I and CL,Q is 100 pF. In the frequency conversion filter circuit 100 according to the first embodiment of the present disclosure, however, the sum capacitance of C1,I, C1,Q, C2,I, and C2,Q is 50 pF, which is half of the sum capacitance of the related art. Since the capacitance of a capacitor in a semiconductor integrated circuit is proportional to a mounting area, it is possible to reduce the cost of the frequency conversion filter circuit 100 according to the first embodiment of the present disclosure, compared to the related art.

As indicated by the reflection characteristics of the graph shown in FIG. 13, the frequency range in which the input impedance matching is satisfactory is broader in the frequency conversion filter circuit 100 according to the first embodiment of the present disclosure than in the frequency conversion filter circuit according to the related art.

The case in which the value of Cf is set to be larger by about 10% in order to expand the range in which the impedance matching is satisfactory has been described. The case in which the value of Cf is set to be larger by about 10% in order to expand the range in which the impedance matching is satisfactory will be described in comparison to a case in which the value of Cf is set by Equation 3 above.

Figure 14:
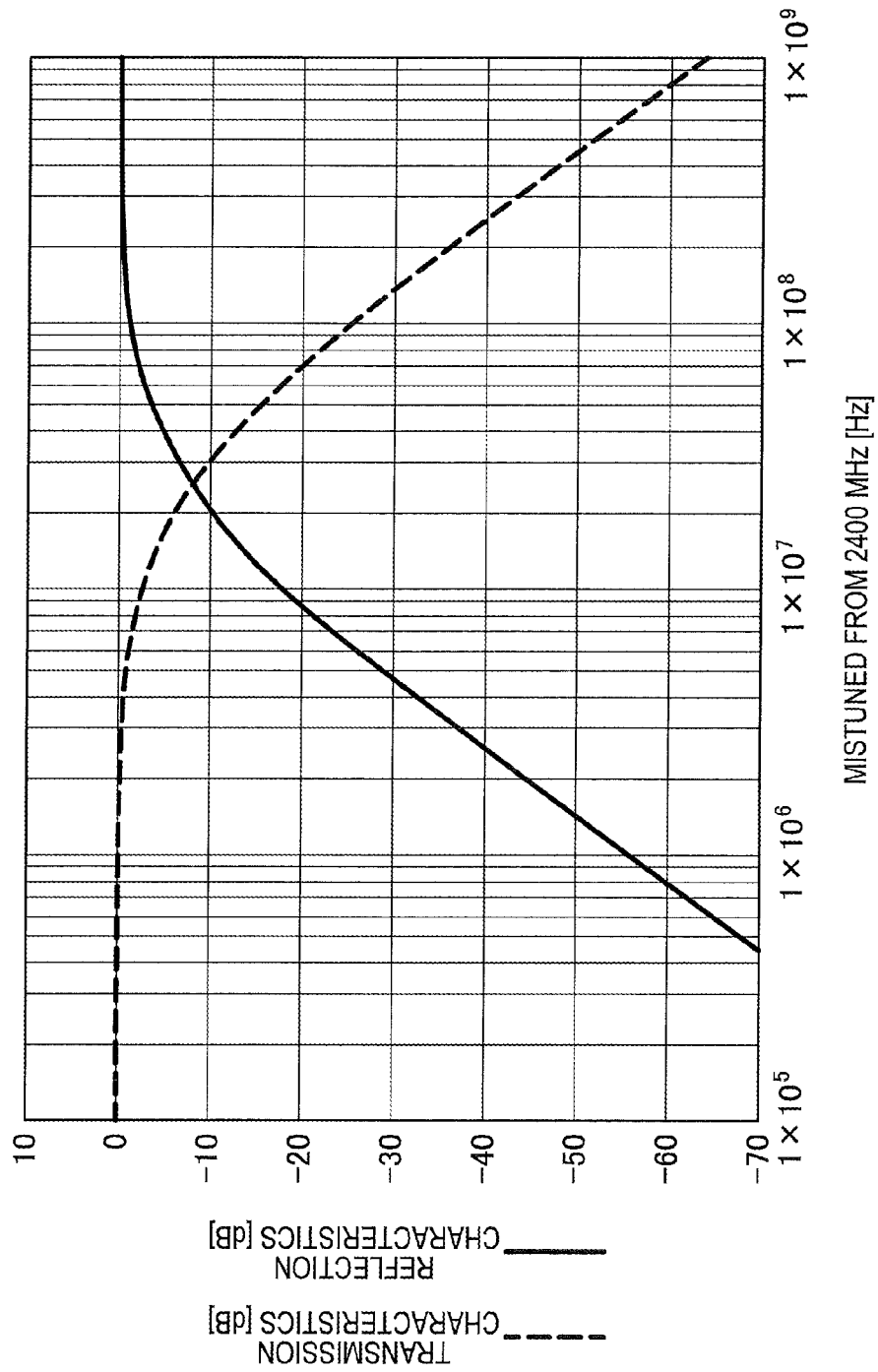
FIG. 14 is a diagram illustrating the reflection characteristics and the transmission characteristics of the frequency conversion filter circuit shown in FIG. 6 expressed by a mistuned frequency.
Figure 15:
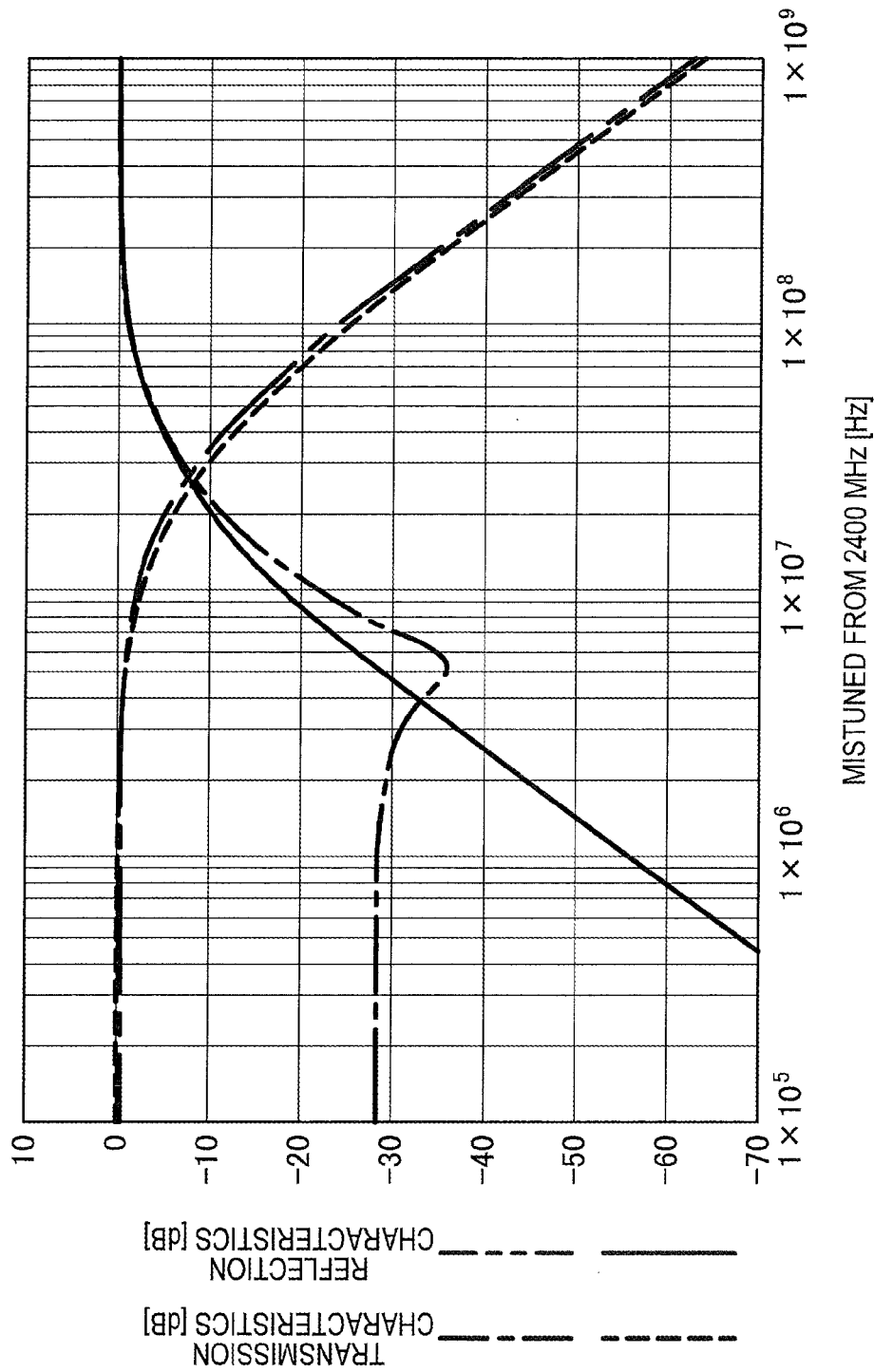
FIG. 15 is a diagram illustrating the reflection characteristics and the transmission characteristics of the frequency conversion filter circuit shown in FIG. 6 expressed by a mistuned frequency.

FIG. 14 is a diagram illustrating the reflection characteristics and the transmission characteristics expressed by a mistuned frequency from 2400 MHz when the element constants other than Cf of the frequency conversion filter circuit 100 shown in FIG. 6 are set to the above-mentioned values and the value of Cf is set to a value obtained by Equation 3 above. FIG. 15 is a graph in which the maximum value is normalized to 0 dB to compare the frequency characteristics between a case in which the value of Cf is set by Equation 3 above and a case in which the value of Cf is set to be larger by about 10%.

As shown in FIG. 15, the transmission characteristics are scarcely changed even when the value of Cf is changed. However, the frequency band in which the reflection coefficient is equal to or less than −14 dB is broader in the case in which the value of Cf is set to be larger by about 10%. Accordingly, it can be understood that the range in which the impedance matching is satisfactory is expanded by setting the value of Cf to be larger by about 10%.

According to the first embodiment of the present disclosure, as described above, when the passive switched capacitor circuit including the flying capacitor is connected to the rear stage of the passive mixer and the capacitance value of the flying capacitor is set to an appropriate value, the range in which the impedance matching is satisfactory is expanded, compared to the frequency conversion filter circuit according to the related art.

3. Second Embodiment of the Present Disclosure

Next, a second embodiment of the present disclosure will be described. A frequency conversion filter circuit according to the second embodiment of the present disclosure has the same configuration as the frequency conversion filter circuit 100 described with reference to FIG. 6 in the first embodiment of the present disclosure. The frequency conversion filter circuit according to the second embodiment of the present disclosure is different from the frequency conversion filter circuit 100 according to the first embodiment of the present disclosure in that the frequency of the local oscillation signal used to drive the passive mixer circuit including the in-phase signal passive mixer 111 and the quadrature signal passive mixer 112 and the frequency of the clock used to drive the passive switched capacitor circuit including the in-phase signal passive switched capacitor circuit 121 and the quadrature signal passive switched capacitor circuit 122 have a relation of a positive integral multiple or a reciprocal of the positive integral multiple.

The frequency of the local oscillation signal used to drive the passive mixer circuits and the frequency of the clock used to drive the passive switched capacitor circuits have the relation of a positive integral multiple or a reciprocal of the positive integral multiple in order to operate the frequency conversion filter circuit in a broader frequency range without changing the capacitance value Cf of the flying capacitor. The capacitance value Cf of the flying capacitor and the frequency of the clock have the relation expressed by Equation 3, as described above. Therefore, for example, when a broad frequency range of 50 MHz to 1600 MHz is covered by a single circuit, the capacitance value Cf of the flying capacitor is changed from 7.76 pF to 243 fF. Thus, a variable range of the capacitance value Cf of the flying capacitor is a task in terms of mounting.

For example, as shown in Table 1, the variable range of the capacitance value Cf can be narrowed from 971 fF to 485 fF by changing a frequency ratio between the local oscillation signal and the clock.

TABLE 1

(EXAMPLE OF FREQUENCY RATIO BETWEEN LOCAL OSCILLATION SIGNAL AND CLOCK)

| LOCAL OSCILLATION FREQUENCY [MHz] | CLOCK FREQUENCY [MHz] | FREQUENCY RATIO | CAPACITANCE Cf [fF] |
|---|---|---|---|
| 50 | 400 | 1:8 | 971 |
| 100 | 800 | 1:8 | 485 |
| 100 | 400 | 1:4 | 971 |
| 200 | 800 | 1:4 | 485 |
| 200 | 400 | 1:2 | 971 |
| 400 | 800 | 1:2 | 485 |
| 400 | 400 | 1:1 | 971 |

TABLE 1-continued (EXAMPLE OF FREQUENCY RATIO BETWEEN LOCAL OSCILLATION SIGNAL AND CLOCK)

| LOCAL OSCILLATION FREQUENCY [MHz] | CLOCK FREQUENCY [MHz] | FREQUENCY RATIO | CAPACITANCE Cf [fF] |
|---|---|---|---|
| 800 | 800 | 1:1 | 485 |
| 800 | 400 | 2:1 | 971 |
| 1600 | 800 | 2:1 | 485 |

As described above, when the frequency of the local oscillation signal used to drive the passive mixer circuits and the frequency of the clock used to drive the passive switched capacitor circuits have the relation of a positive integral multiple or a reciprocal of the positive integral multiple, the frequency conversion filter circuit can be configured to operate in a broader frequency range.

4. Third Embodiment of the Present Disclosure

Figure 16:
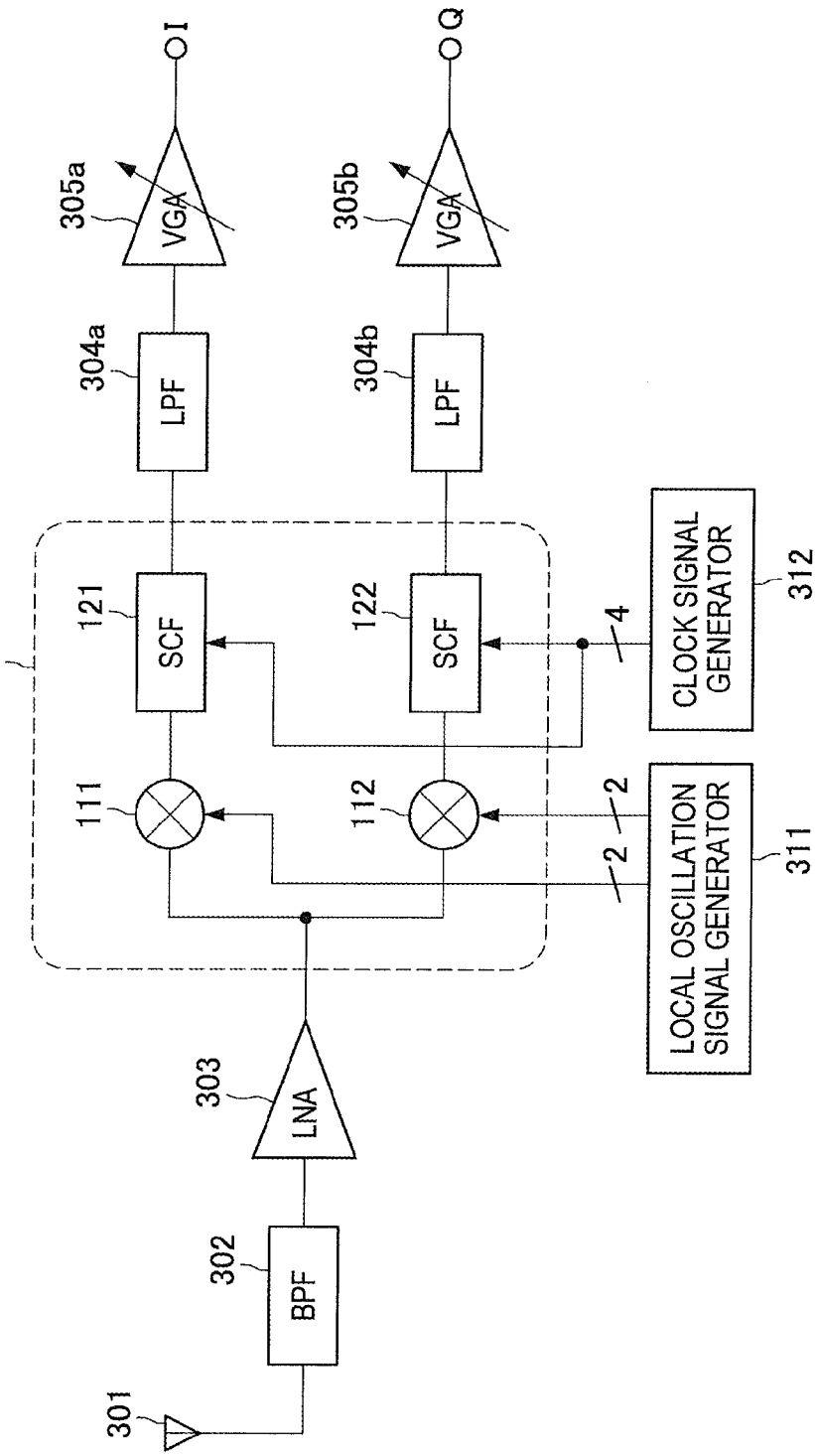
FIG. 16 is a diagram illustrating the overall configuration of a radio receiver according to a third embodiment of the present disclosure.

Next, a third embodiment of the present disclosure will be described. FIG. 16 is a diagram illustrating the overall configuration of a radio receiver according to the third embodiment to which the frequency conversion filter circuit according to each embodiment of the present disclosure above described is applied. Hereinafter, the overall configuration of a radio receiver 300 according to the third embodiment of the present disclosure will be described with reference to FIG. 16.

As shown in FIG. 16, the radio receiver 300 according to the third embodiment of the present disclosure includes an antenna 301, a bandpass filter 302, a low noise amplifier 303, the frequency conversion filter circuit 100, lowpass filters 304a and 304b, variable gain amplifiers 305a and 305b, a local oscillation signal generator 311, and a clock signal generator 312.

Next, an operation of the radio receiver 300 according to the third embodiment of the present disclosure will be described. The bandpass filter 302 selects a desired frequency range of a high-frequency signal received by the antenna 301 and the low noise amplifier 303 amplifies the selected frequency range of the high-frequency signal. The signal amplified by the low noise amplifier 303 is supplied to the frequency conversion filter circuit 100 through a transmission line with predetermined impedance.

The frequency conversion filter circuit 100 performs selection of the desired frequency range and down-conversion to generate an in-phase component I and a quadrature component Q of a baseband signal. The lowpass filters 304a and 304b eliminate neighboring disturbing waves from the in-phase component I and a quadrature component Q of the baseband signal generated by the frequency conversion filter circuit 100, respectively. Then, the variable gain amplifiers 305a and 304b amplify the in-phase component I and a quadrature component Q, respectively. Signals used to drive the frequency conversion filter circuit 100 are given from the local oscillation signal generator 311 and the clock signal generator 312.

Here, the bandpass filter 302 may not be provided when desired characteristics can be obtained with the frequency selection characteristics of the frequency conversion filter circuit 100 according to each embodiment of the present disclosure. Likewise, the low noise amplifier 303 may not be provided when the frequency conversion filter circuit 100 is connected directly to the antenna, but the impedance matching can satisfactorily be maintained and thus desired characteristics can be obtained in terms of reception sensitivity.

5. Summarization

According to the embodiments of the present disclosure described above, the frequency conversion filter circuit 100 includes the passive mixer circuit including the in-phase signal passive mixer 111 and the quadrature signal passive mixer 112, and the passive switched capacitor circuit including the in-phase signal passive switched capacitor circuit 121 and the quadrature signal passive switched capacitor circuit 122. The passive mixer circuit generates a baseband signal by multiplying the input signal supplied from the predetermined signal source impedance 101 by the local oscillation signal and outputs the baseband signal to the passive switched capacitor circuit.

The frequency conversion filter circuit 100 can obtain low-pass filter characteristics by converting only the frequency of the local oscillation signal in the impedance of a baseband of the passive switched capacitor circuit through interaction of the passive mixer circuit and the passive switched capacitor circuit into a high frequency, matching the input impedance of the passive mixer circuit to the signal source impedance, and passing the baseband signal through the passive switched capacitor circuit. Further, in regard to the filter characteristics, the bandwidth of the filter can be further expanded, compared to a frequency conversion filter circuit according to the related art, and the steep attenuation characteristics can be obtained. Furthermore, the advantage of reducing the manufacturing cost can be obtained by reducing the mounting area.

In the second embodiment of the present disclosure, the passive switched capacitor circuit is driven by the clock signals of the square waves having the duty ratio of 25% and four phases different from each other by 90 degrees. The frequency of the clock signal and the frequency of the local oscillation signal input into the passive mixer circuit have the relation of a positive real number multiple or a reciprocal multiple of the positive real number multiple. Thus, the frequency conversion filter circuit can operate in a broader frequency range without changing the capacitance value of the flying capacitor. Further, the input impedance of the frequency conversion filter circuit can be matched to the signal source impedance by changing the electrostatic capacitance value of the flying capacitor of the passive switched capacitor circuit so as to be inversely proportional to the frequency of the clock signal.

In the third embodiment of the present disclosure, there is provided the radio receiver including the frequency conversion filter circuit according to the first or second embodiment of the present disclosure that is connected to the antenna receiving a high-frequency signal and the transmission line which has a predetermined impedance and through which the high-frequency signal received by the antenna is transmitted.

It should be understood by those skilled in the art that various modifications, combinations, sub-combinations and alterations may occur depending on design requirements and other factors insofar as they are within the scope of the appended claims or the equivalents thereof.

Additionally, the present technology may also be configured as below.

(1) A filter circuit including:
a passive mixer circuit; and
a passive switched capacitor circuit that is connected to a rear stage of the passive mixer and includes a flying capacitor,
wherein the passive mixer circuit generates a baseband signal by multiplying an input signal supplied from a predetermined signal source impedance by each local oscillation signal and outputs the baseband signal to the passive switched capacitor circuit,
the passive switched capacitor circuit performs predetermined filtering on the baseband signal supplied from the passive mixer circuit and outputs the processed baseband signal, and
a capacitance of the flying capacitor of the passive switched capacitor circuit is a capacitance by which input impedance of the passive mixer circuit is matched to the signal source impedance.

(2) The filter circuit according to (1),
wherein the flying capacitor of the passive switched capacitor circuit maintains a polarity when switched from an input end to an output end through a switching operation, while reversing the polarity when switched from the output end to the input end, and
the passive switched capacitor circuit further includes a first capacitor that is connected in parallel to the flying capacitor at the input end of the flying capacitor and a second capacitor that is connected in parallel to the flying capacitor at the output end of the flying capacitor.

(3) The filter circuit according to (1) or (2), wherein the capacitance of the flying capacitor is greater by a predetermined amount than the capacitance by which the input impedance of the passive mixer circuit is matched to the signal source impedance.

(4) The filter circuit according to any of (1) to (3), wherein the passive mixer circuit includes an in-phase signal passive mixer circuit and a quadrature signal passive mixer circuit.

(5) The filter circuit according to (4), wherein the in-phase signal passive mixer circuit and the quadrature signal passive mixer circuit multiply the input signal by each of the local oscillation signals with different phases.

(6) The filter circuit according to (5), wherein the in-phase signal passive mixer circuit and the quadrature signal passive mixer circuit multiply the input signal by each of the local oscillation signals of square waves having phases different from each other by 90 degrees and a duty ratio of 25%.

(7) The filter circuit according to any of (4) to (6), wherein the passive switched capacitor circuit includes an in-phase signal passive switched capacitor circuit and a quadrature signal passive switched capacitor circuit which are connected to the in-phase passive mixer circuit and the quadrature signal passive mixer circuit, respectively.

(8) The filter circuit according to (7), wherein the passive switched capacitor circuit is driven by clock signals of four-phase square waves having phases different from each other by 90 degrees and a duty ratio of 25%.

(9) The filter circuit according to (8), wherein a frequency of the clock signal is a positive real number multiple or a reciprocal multiple of a frequency of the local oscillation signal input into the passive mixer circuit.

(10) The filter circuit according to any of (7) to (9), wherein an electrostatic capacitance value of the flying capacitor of the passive switched capacitor circuit is changed to be inversely proportional to a frequency of the clock signal.

(11) The filter circuit according to any of (7) to (10), wherein the local oscillation signals and clock signals are independent.

(12) A radio receiver including:
a filter circuit according to any of (1) to (11).

The present disclosure contains subject matter related to that disclosed in Japanese Priority Patent Application JP 2011-181341 filed in the Japan Patent Office on Aug. 23, 2011, the entire content of which is hereby incorporated by reference.

What is claimed is:

1. A filter circuit comprising:
a passive mixer circuit; and
a passive switched capacitor circuit that is connected to a rear stage of the passive mixer and includes a flying capacitor,
wherein the passive mixer circuit generates a baseband signal by multiplying an input signal supplied from a predetermined signal source impedance by each local oscillation signal and outputs the baseband signal to the passive switched capacitor circuit,
the passive switched capacitor circuit performs predetermined filtering on the baseband signal supplied from the passive mixer circuit and outputs the processed baseband signal, and
a capacitance of the flying capacitor of the passive switched capacitor circuit is a capacitance by which input impedance of the passive mixer circuit is matched to the signal source impedance.

2. The filter circuit according to claim 1,
wherein the flying capacitor of the passive switched capacitor circuit maintains a polarity when switched from an input end to an output end through a switching operation, while reversing the polarity when switched from the output end to the input end, and
the passive switched capacitor circuit further includes a first capacitor that is connected in parallel to the flying capacitor at the input end of the flying capacitor and a second capacitor that is connected in parallel to the flying capacitor at the output end of the flying capacitor.

3. The filter circuit according to claim 1, wherein the capacitance of the flying capacitor is greater by a predetermined amount than the capacitance by which the input impedance of the passive mixer circuit is matched to the signal source impedance.

4. The filter circuit according to claim 1, wherein the passive mixer circuit includes an in-phase signal passive mixer circuit and a quadrature signal passive mixer circuit.

5. The filter circuit according to claim 4, wherein the in-phase signal passive mixer circuit and the quadrature signal passive mixer circuit multiply the input signal by each of the local oscillation signals with different phases.

6. The filter circuit according to claim 5, wherein the in-phase signal passive mixer circuit and the quadrature signal passive mixer circuit multiply the input signal by each of the local oscillation signals of square waves having phases different from each other by 90 degrees and a duty ratio of 25%.

7. The filter circuit according to claim 4, wherein the passive switched capacitor circuit includes an in-phase signal passive switched capacitor circuit and a quadrature signal passive switched capacitor circuit which are connected to the in-phase passive mixer circuit and the quadrature signal passive mixer circuit, respectively.

8. The filter circuit according to claim 7, wherein the passive switched capacitor circuit is driven by clock signals of four-phase square waves having phases different from each other by 90 degrees and a duty ratio of 25%.

9. The filter circuit according to claim 8, wherein a frequency of the clock signal is a positive real number multiple or a reciprocal multiple of a frequency of the local oscillation signal input into the passive mixer circuit.

10. The filter circuit according to claim 7, wherein an electrostatic capacitance value of the flying capacitor of the passive switched capacitor circuit is changed to be inversely proportional to a frequency of the clock signal.

11. The filter circuit according to claim 7, wherein the local oscillation signals and clock signals are independent.

12. A radio receiver comprising:
a filter circuit according to claim 1.

* * * * *